(12) United States Patent
Lin et al.

(10) Patent No.: US 9,871,217 B1
(45) Date of Patent: Jan. 16, 2018

(54) TRANSPARENT CONDUCTIVE FILM AND ELECTRO-OPTICAL DEVICE HAVING THE SAME

(71) Applicant: National Tsing Hua University, Hsinchu (TW)

(72) Inventors: Hao-Wu Lin, Hsinchu (TW); Yu-Cheng Shiau, Hsinchu (TW)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 15/448,595

(22) Filed: Mar. 3, 2017

(30) Foreign Application Priority Data

Dec. 28, 2016 (TW) .............................. 105143507 A

(51) Int. Cl.
| | | |
|---|---|---|
| *H01L 51/00* | (2006.01) | |
| *H01L 51/44* | (2006.01) | |
| *H01L 51/50* | (2006.01) | |
| *H01L 51/52* | (2006.01) | |

(52) U.S. Cl.
CPC ........ *H01L 51/442* (2013.01); *H01L 51/5056* (2013.01); *H01L 51/5234* (2013.01); *H01L 51/5281* (2013.01); *H01L 51/005* (2013.01); *H01L 51/0035* (2013.01); *H01L 51/0037* (2013.01); *H01L 51/0047* (2013.01); *H01L 51/0053* (2013.01); *H01L 51/0056* (2013.01); *H01L 51/0072* (2013.01); *H01L 51/0078* (2013.01); *H01L 2251/301* (2013.01); *H01L 2251/558* (2013.01)

(58) Field of Classification Search
CPC ....................................................... H01L 51/442
See application file for complete search history.

(56) References Cited

U.S. PATENT DOCUMENTS

| | | | | |
|---|---|---|---|---|
| 5,965,246 A | * | 10/1999 | Guiselin | ............. C03C 17/3423 |
| | | | | 359/580 |
| 2004/0140758 A1 | * | 7/2004 | Raychaudhuri | ..... H01L 51/5088 |
| | | | | 313/504 |
| 2014/0196787 A1 | * | 7/2014 | Hanaki | ................... C08K 3/04 |
| | | | | 136/263 |

* cited by examiner

*Primary Examiner* — William Harriston

(57) ABSTRACT

Compared to traditional ITO transparent substrate showing drawbacks of high sheet resistance, poor flexibility and high manufacturing cost, the present invention mainly discloses a transparent conductive film fabricated by sequentially forming a wetting layer and an ultra-thin metal layer onto a transparent substrate, wherein the transparent conductive film includes advantages of low sheet resistance, high transmittance, great flexibility, and low manufacturing cost. Moreover, a variety of experiment data have proved that, this novel transparent conductive film can not only be applied in the fabrication of some electro-optical devices such as organic solar cell and OLED, but also helpful to the enhancement of the fundamental and essential characteristics of the electro-optical devices.

18 Claims, 17 Drawing Sheets

TRANSPARENT CONDUCTIVE FILM AND ELECTRO-OPTICAL DEVICE HAVING THE SAME

BACKGROUND OF THE INVENTION

1. Field of the Invention

The present invention relates to the technology field of ultra-thin and highly-conductive metal electrodes, and more particularly to a transparent conductive film and electro-optical devices having the same.

2. Description of the Prior Art

It is well known that touch panels comprising transparent conductive substrate and sensing circuitry are mainly applied in the electronic devices with small screen size such as smart phone and tablet PC. However, with the growing of demands made by market on All-in-One PCs, large-scale notebooks and displays with large-size touch panel, expensive manufacturing cost and high sheet resistance of traditional ITO transparent conductive substrate have become the major problems of the large-size touch panel. As the person skilled in development and manufacture of the transparent conductive substrates knows, the cost of forming ITO electrode layer occupies forty percent of a total manufacturing cost of the traditional ITO transparent conductive substrate. Moreover, ITO electrode formed on a glass substrate of the ITO transparent conductive substrate exhibits an average sheet resistance of 20 ohm/sq.

The said ITO transparent conductive substrate is often adapted for being as an OLED substrate. Please refer to FIG. 1, which illustrates a cross-sectional side view of a typical OLED. As FIG. 1 shows, typical OLED 1' mainly comprises: a glass substrate 11', an anode electrode layer 12', an organic active layer 13', and a cathode electrode layer 14', wherein the anode electrode layer 12' is made of ITO material. It is worth explaining that, the said glass substrate 11' is arranged to be the top of the OLED 1' for facilitating the out coupling of light generated by the organic active layer 13'. However, the said glass substrate 11' is planned to be a supporting bottom of the anode electrode layer 12', the organic active layer 13', and the cathode electrode layer 14' as the fabrication of the OLED 1'.

Literature 1 has reported that the light emission performance of the typical OLED 1' is limited due to low out-coupling efficiency. Herein literature 1 is proposed by Hong et.al, entitled with "Review Paper: Recent Developments in Light Extraction Technologies of Organic Light Emitting Diodes", and published on Electronic Materials Letters (Vol. 7, No. 2 (2001), pp. 77-91). In FIG. 1, the light generated by the organic active layer 13' gets out of the OLED 1' along light path A' and exhibits an out-coupling efficiency ($\eta_{out}$) of 18%. It is worth noting that, due to refractive index differences occurring between the organic active layer 13' ($n_{ORGANIC}=1.6-1.8$), the anode electrode layer 12' ($n_{ITO}=1.8$), the glass substrate ($n_{GLASS}=1.5$), and air ($n_{AIR}=1$), light path B' occurs in the internal of the OLED 1' and means a significant portion of the generated light is confined within the electrode-organic interface due to interference effect. Literature 1 particularly called this interference effect as waveguide influence to the emission light, and the said waveguide influence would lead to the lowering of external quantum efficiency (EQE) of the OLED 1' by limiting the emission light's out-coupling efficiency.

Moreover, light path C' is called substrate influence to the emission light, which means a significant portion of the generated light is confined within the glass-ITO interface due to interference effect. On the other hand, being influenced by the surface plasmon polaritons (SPPs) at the interface of the organic active layer 13' (dielectric) and the cathode electrode layer 14', a portion of the generated light is dissipated as scattered light or as a non-radiative emission in the cathode electrode layer 14'.

Besides the issue of sheet resistance, increasing of the manufacturing cost resulted from year to year decreasing of the indium resources has become the most important problem for the ITO transparent conductive substrate. Thus, for the purpose of manufacturing cost saving, manufacturers of the transparent conductive substrate have made great efforts to research and develop a new material for replacing ITO. Because silver exhibits an outstanding conductivity (~6.3× $10^5$ S/cm), metal mesh made of silver nanowires (AgNW) is substituted for the application of ITO in fabricating the transparent conductive substrate. To fabricate the transparent conductive substrate having the metal mesh, a AgNW dispersion (or suspension) is firstly coated onto a transparent substrate like glass by using a specific process, for example, spin coating process, rod coating process, drop casting process, or air spraying process. After that, the AgNW film coated onto the transparent substrate is subsequently treated with a heat process such as annealing.

Since each of the silver nanowires are an individual object, the conductivity of the metal mesh is determined by staggering and overlapping of the silver nanowires. Thus, it is able to know that the metal mesh shows a higher surface roughness after being compared with the high flatness exhibited by the traditional ITO electrode. In spite of that, low refractive index ($n_{AgNW}=1.3-1.5$) of silver nanowires makes the OLED having silver nanowire transparent conductive substrate perform an excellent out-coupling efficiency ($\eta_{out}>20\%$).

Following Table (1) has integrated merits and demerits of the traditional ITO transparent conductive substrate and the silver nanowire transparent conductive substrate. From Table (1), it is understood that there is a lack of related technology and equipment for the mass production of the silver nanowire transparent conductive substrate even though the out-coupling efficiency of the OLED having silver nanowire transparent conductive substrate is greater than 20%.

TABLE (1)

| Material of electrode | Transmittance Conductivity | Flatness | Price | $\eta_{out}$ | mass production Way |
|---|---|---|---|---|---|
| ITO | Good | Good | High | 18-20% | The ITO electrode layer is formed on glass substrate by using well-developed sputtering process. |
| AgNW | Good | Not good (high surface roughness) | Between high and low | >20% | There is a lack of related technology and equipment for the mass production of the silver nanowire transparent conductive substrate. Currently, the |

TABLE (1)-continued

| Material of electrode | Transmittance Conductivity | Flatness | Price | η$_{out}$ | mass production Way |
|---|---|---|---|---|---|
| | | | | | AgNW film is coated onto glass substrate by spin-coating process or spin coating or mechanical scraping process. |

Therefore, through above descriptions, engineers skilled in the development and manufacture of various transparent conductive substrates are able to understand that, due to expensive manufacturing cost and high sheet resistance of traditional ITO transparent conductive substrate, how to develop a transparent conductive substrate having novelty to replace the for replacing ITO hence becomes the most issue in nowaday. In addition, it must simultaneously consider how to reduce light loss phenomenon like SPPs occurring in electro-optical device having the developed novel transparent conductive substrate, such as OLED. Accordingly, in view of the traditional ITO transparent conductive substrate showing many drawbacks and shortcomings in the applications of various electro-optical devices, the inventors of the present application have made great efforts to make inventive research thereon and eventually provided a transparent conductive film and electro-optical devices having the same.

SUMMARY OF THE INVENTION

The primary objective of the present invention is to provide a transparent conductive film and electro-optical devices having the same. Compared to traditional ITO transparent substrate showing drawbacks of high sheet resistance, poor flexibility and high manufacturing cost, the present invention mainly discloses a transparent conductive film fabricated by sequentially forming a wetting layer and an ultra-thin metal layer onto a transparent substrate, wherein the transparent conductive film includes advantages of low sheet resistance, high transmittance, great flexibility, and low manufacturing cost. Moreover, a variety of experiment data have proved that, this novel transparent conductive film can not only be applied in the fabrication of some electro-optical devices such as organic solar cell and OLED, but also helpful to the enhancement of the fundamental and essential characteristics of the optical devices.

In order to achieve the primary objective of the present invention, the inventor of the present invention provides one embodiment for the transparent conductive film, comprising:
a transparent substrate;
a wetting layer, being formed on the transparent substrate and having a refractive index greater than 2.1; and
a metal layer, being formed on the wetting layer;
wherein the wetting layer is used for enhancing the wettability of the metal layer, so as to facilitate the metal layer exhibit an excellent conductivity as the metal layer formed on the wetting layer has an effective thickness;
wherein the effective thickness is at least 5 nm.

Moreover, for achieving the primary objective of the present invention, the inventor of the present invention further provides one embodiment for the electro-optical device; wherein the electro-optical device is an organic light-emitting diode (OLED) comprising the aforesaid transparent conductive film, and further comprises:
an anti-reflective layer, being formed on the metal layer of the transparent conductive film;
an organic active layer, being formed on the anti-reflective layer; and
an cathode layer, being formed on the organic active layer.

Furthermore, in order to achieve the primary objective of the present invention, the inventor of the present invention further provides another one embodiment for the electro-optical device; wherein the electro-optical device is a solar cell comprising the aforesaid transparent conductive film, and further comprises:
an electron extraction layer, being formed on the metal layer of the transparent conductive film;
a photoactive layer, being formed on the electron extraction layer;
a hole transport layer, being formed on the photoactive layer; and
an electrode layer, being formed on the hole transport layer.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a transparent conductive film and electro-optical devices having the transparent conductive film according to the present invention, embodiments of the present invention will be described in detail with reference to the attached drawings hereinafter.

Figure 1:
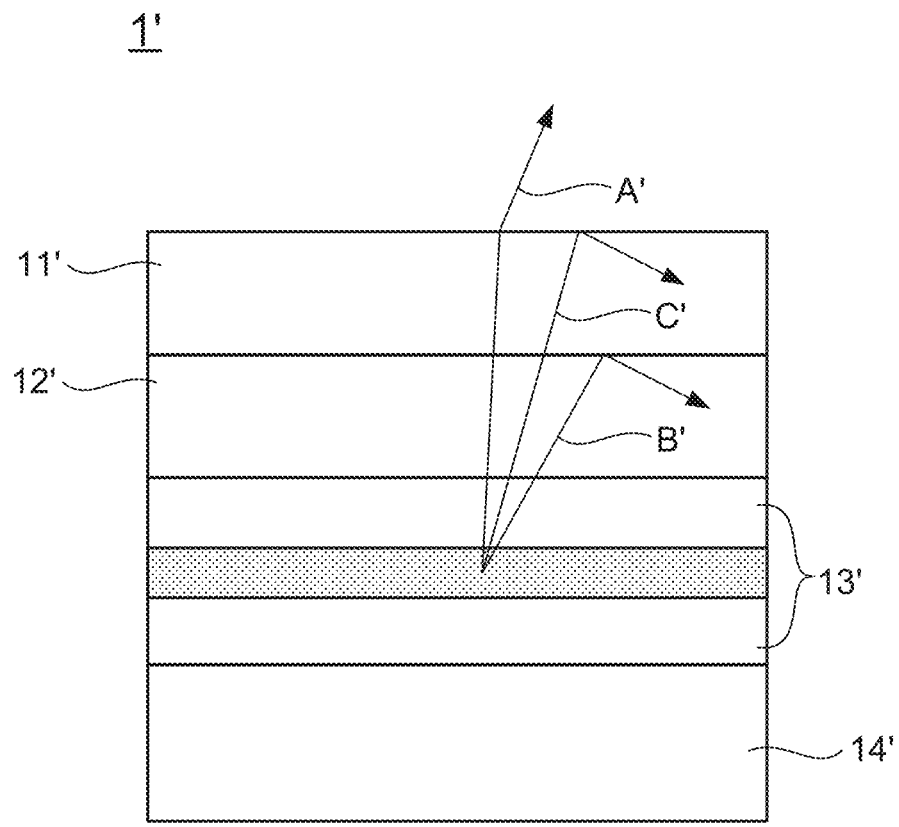
FIG. 1 shows a cross-sectional side view of a typical OLED.
Figure 2:
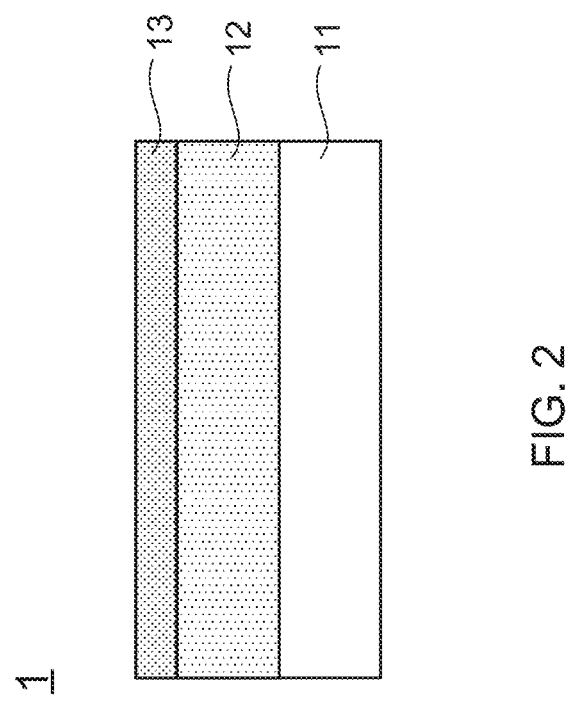
FIG. 2 shows a schematic cross-sectional side view of a transparent conductive film according to the present invention.

With reference to FIG. 2, there is provided a schematic cross-sectional side view of a transparent conductive film according to the present invention is provided. As FIG. 2 shows, the transparent conductive film 1 of the present invention mainly comprises: a transparent substrate 11, a wetting layer 12 and a metal layer 13. As engineers skilled in the development and manufacture of conventional transparent conductive substrates know, the transparent substrate 11 can be made of a hard material such as glass or a soft material like polyethylene terephthalate (PET). Moreover, the wetting layer is formed on the transparent substrate by using sputter deposition process, and the metal layer is also formed on the wetting layer through the use of sputter deposition process.

The primary technology feature of the present invention is to decide the most suitable material to form the wetting layer 12, so as to enhance the wettability of the metal layer 13. Thus, when the deposition thickness of the metal layer 13 formed on the wetting layer 12 reaches an effective thickness, the metal layer 13 exhibits an excellent conductivity. Following Table (2) has recorded measurement data of sheet resistance of different silver-made metal layers. From Table (2), it can find that, the silver-made metal layer 13 directly formed on the transparent substrate 11 by using evaporation deposition process exhibits a low sheet resistance of 131 ohm/sq in the case of having a thickness of 13 nm. Briefly speaking, it must make the thickness of the evaporated silver film be greater than 13 nm in order to facilitate the evaporated silver film on the transparent substrate 11 perform good conductivity.

TABLE (2)

| Thickness (nm) | Evaporated silver film Sheet resistance (ohm/sq) | TiO$_2$ wetting layer + evaporated silver film Sheet resistance (ohm/sq) | Nb$_2$O$_5$ wetting layer + evaporated silver film Sheet resistance (ohm/sq) | TiO$_2$ wetting layer + sputtered silver film Sheet resistance (ohm/sq) | Nb$_2$O$_5$ wetting layer + sputtered silver film Sheet resistance (ohm/sq) |
|---|---|---|---|---|---|
| 4 | — | — | — | 1 × 10$^9$ | 1 × 10$^9$ |
| 5 | — | 1 × 10$^9$ | 1 × 10$^9$ | 201 | 115.34 |
| 7 | — | 1.5 × 10$^5$ | 36 | 38.7 | 15.7 |
| 9 | — | 16 | 10 | 12 | 9.6 |
| 11 | 1 × 10$^9$ | — | 6.8 | — | 7.4 |
| 13 | 131 | — | 4.8 | — | 5.2 |
| 15 | 21 | — | 4.7 | — | 4.46 |

It is worth noting that, for the silver-made metal layer 13 formed on the Nb$_2$O$_5$-made wetting layer 12 by the use of sputter deposition process, it does particularly exhibit an outstanding conductivity of 115.34 ohm/sq in the case of having 5 nm deposition thickness. On the other hand, in order to facilitate the silver-made metal layer 13 formed on the Nb$_2$O$_5$-made wetting layer 12 by using evaporation deposition process perform an excellent conductivity, the thickness of the evaporated silver film must be controlled to be at least 7 nm. Therefore, the experimental data listed in Table (2) have proved that, disposing one wetting layer 12 between the metal layer 13 and the transparent substrate 11 shows a greater help to enhance the wettability and reduce an effective thickness of the metal layer 13. Moreover, the experimental data have also proved that the sputtered metal layer possesses outstanding conductivity greater than the evaporated metal layer's.

It is expected that the wetting layer 12 does not limited to be made of niobium oxide (Nb$_2$O$_5$). In the present invention, the wetting layer 12 can also be made of titanium oxide (TiO$_2$), tellurium oxide (TeO$_2$), molybdenum oxide (MoO3), zirconium oxide (ZrO$_2$), tantalum oxide (TaO$_2$), or other metal oxides. However, inventors of the present invention find that not all of metal oxides are suitable for being as the wetting layer 12 formed between the metal layer 13 and the transparent substrate 11. Based on the research and study of the inventors, materials having surface energy greater than metal layer's 13 are preferably used as the said wetting layer 12 for enhancing the wettability of the metal layer 13.

Please refer to Table (3) provided below, which has recorded measurement data of surface energy of different samples including: glass substrate, Nb$_2$O$_5$ film, sputtered silver film, evaporated silver film, and TiO$_2$ film

TABLE (3)

| Sample | Contact angle (DIW) ($\theta_Y$) | Contact angle (CH$_2$I$_2$) ($\theta_Y$) | Disperse component $\gamma_{SV}^d$ (mJ/m$^2$) | polar component $\gamma_{SV}^P$ (mJ/m$^2$) | Surface energy $\gamma_{SV}$ (mJ/m$^2$) |
|---|---|---|---|---|---|
| glass substrate | 57° | 44° | 37.5 | 14.97 | 52.47 |
| Nb$_2$O$_5$ film | 18° | 42° | 38.6 | 34.6 | 73.2 |
| sputtered silver film | 44° | 15° | 49.1 | 17.5 | 66.6 |
| evaporated silver film | 39° | 13° | 49.5 | 19.9 | 69.4 |
| TiO$_2$ film | 24° | 43° | 38.1 | 32.7 | 70.8 |

It is able to calculate surface energy of material through the use of Owen-Wendt model including two mathematical equations shown as below:

$$\gamma_{SV} = \gamma_{SV}^d + \gamma_{SV}^P \tag{1}$$

$$\gamma_{LV}(1 + \cos\theta_Y) = 2\sqrt{\gamma_{SV}^d + \gamma_{LV}^d} + 2\sqrt{\gamma_{SV}^P + \gamma_{LV}^P} \tag{2}$$

In above-presented equations, $\gamma_{SV}$ and $\gamma_{LV}$ represent surface energy of a solid and surface energy of a liquid. Moreover, $\gamma_{SV}^d$ and $\gamma_{LV}^d$ are disperse component of the solid's surface energy and disperse component of the liquid's surface energy, and $\gamma_{SV}^P$ and $\gamma_{LV}^P$ are polar component of the solid's surface energy and polar component of the liquid's surface energy. In addition, $\theta_Y$ means a contact angle between the liquid and the solid.

From Table (3), it can find that the surface energy, the disperse component and the polar component of the silver-made metal layer 13 formed by using evaporation deposition process are all greater than those measured from the silver-made metal layer 13 formed by the use of sputter deposition process. Moreover, it is worth noting that, in spite of the disperse component of Nb$_2$O$_5$-made wetting layer 12 is lower than the disperse component of the silver-made metal layer 13, the surface energy and polar component of the Nb$_2$O$_5$-made wetting layer 12 are both greater than those measured from the silver-made metal layer 13. Thus, after studying the measurement data, two physical properties can be concluded as follows:

(1) Compared to evaporation deposition process, sputter deposition process is able to obviously reduce the surface energy of the silver-made metal layer 13 formed on the wetting layer 12; and (2) When the surface energy of the wetting layer 12 is greater than the metal layer's 13, the wettability of the metal layer 13 would be effectively enhanced so as to provide a great help to the filming of the metal layer 13; therefore, the effective thickness of the metal layer is hence reduced.

Figure 3:
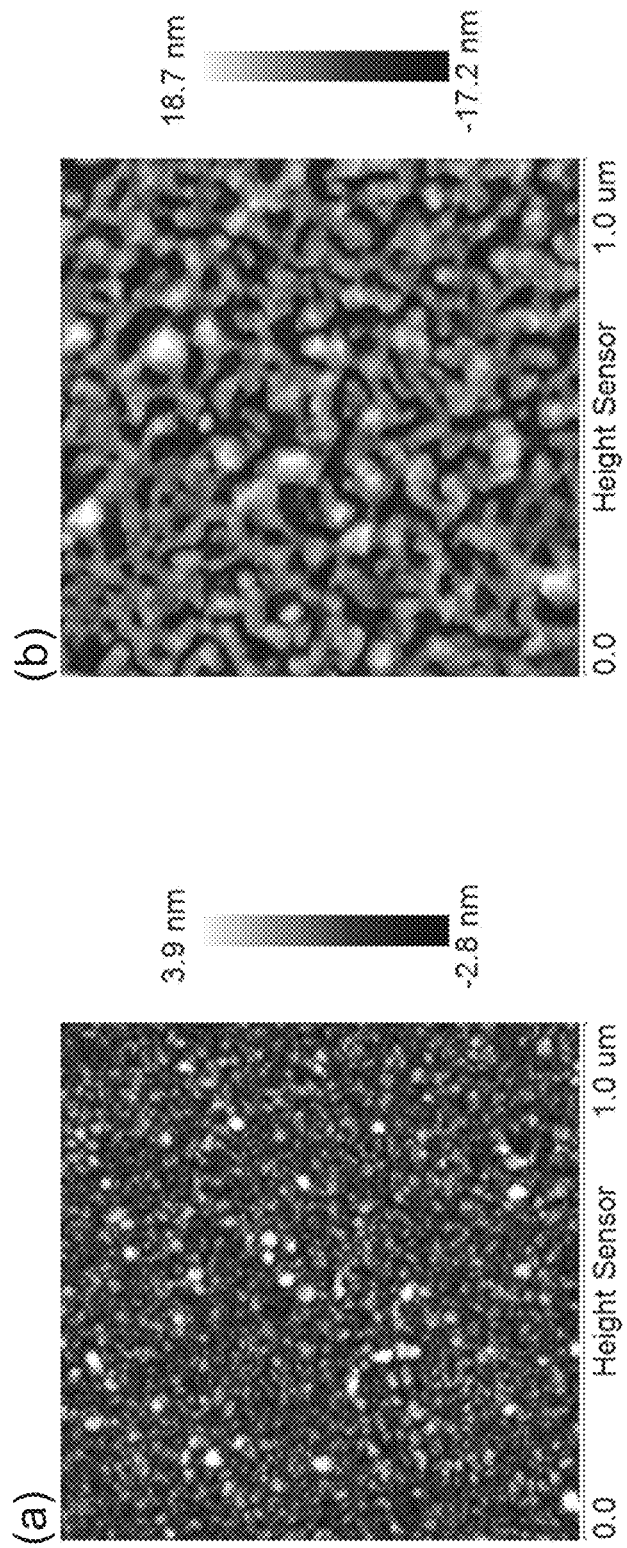
FIG. 3 shows an in-focus image of a metal layer on a wetting layer of the transparent conductive film obtained by using an atomic-force microscopy (AFM)

Please continuously refer to FIG. 3, which shows an in-focus image of the metal layer on the wetting layer obtained by using an atomic-force microscopy (AFM), wherein information of images (a) and (b) shown in FIG. 3 are integrated in following Table (4) and Table (5). From Table (4) and Table (5), it is understood that the said wetting layer can also significantly reduce surface roughness of the metal layer 13 and facilitate the metal layer 13 has a flat surface.

TABLE (4)

| Image | Information |
|---|---|
| (a) | AFM image of a metal layer formed on an Nb$_2$O$_5$-made wetting layer, wherein the metal layer is a sputtered silver-made metal layer and has a deposition thickness of 9 nm. |
| (b) | AFM image of a metal layer formed on an Nb$_2$O$_5$-made wetting layer, wherein the metal layer is an evaporated silver-made metal layer and has a deposition thickness of 9 nm. |

TABLE (5)

| Testing sample | Sheet resistance (ohm/sq) | Roughness | | |
|---|---|---|---|---|
| | | Mean-square value ($R_q$) | Average value ($R_a$) | maximum height profile ($R_p$) |
| Sputtered silver film with 9 nm thickness | 12 | 0.885 nm | 0.671 nm | 8.72 nm |
| Evaporated silver film with 9 nm thickness | 36 | 5.78 nm | 4.7 nm | 35.2 nm |

Figure 4:
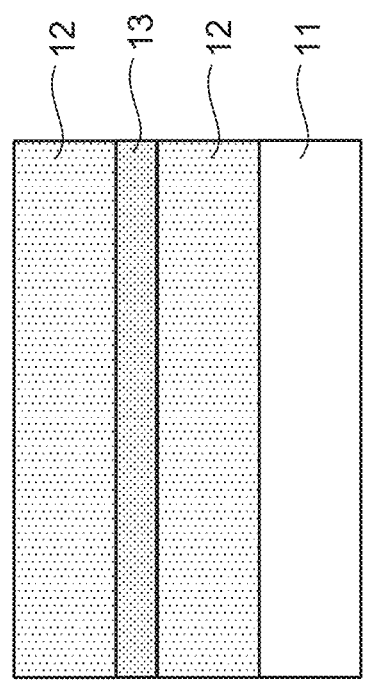
FIG. 4 shows a schematic cross-sectional side view of a transparent conductive film according to the present invention.
Figure 5:
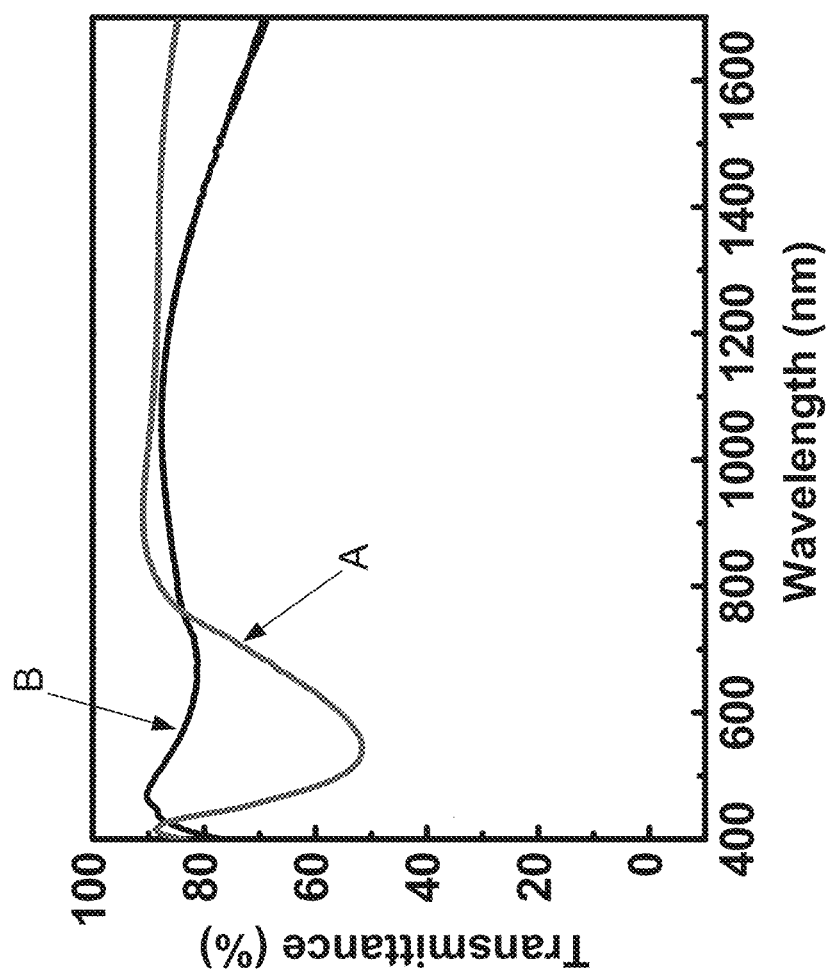
FIG. 5 shows a data curve graph of wavelength versus transmittance.

Because the silver-made metal layer 13 on the wetting layer 12 is a ultra-thin metal film showing outstanding flatness, the transparent conductive film 1 consisting of the transparent substrate 11, the wetting layer 12 and the metal layer 13 hence exhibits excellent properties on transmittance and conductivity. Continuously, please refer to FIG. 4, where a schematic cross-sectional side view of the transparent conductive film of the present invention is provided. As FIG. 4 shows, the transparent conductive film 1 of the present invention is further processed to have a dielectric-metal-dielectric (DMD) structure in order to determine whether the novel transparent conductive film 1 can be used to replace the applications of conventional ITO substrate. Herein the said dielectric is made of Nb$_2$O$_5$. Please simultaneously refer to FIG. 5, which provides a data curve graph of wavelength versus transmittance. Information of data curves A and B are integrated in following Table (6).

TABLE (6)

| Curve | Information |
|---|---|
| A | Curve A is measured from a test sample constituted by a transparent substrate, a 90 nm thick Nb$_2$O$_5$ wetting layer, a 5 nm thick silver-made metal layer, and a 90 nm thick Nb$_2$O$_5$ wetting layer. |
| B | Curve B is measured from a test sample constituted by a transparent substrate, a 45 nm thick Nb$_2$O$_5$ wetting layer, a 5 nm thick silver-made metal layer, and a 45 nm thick Nb$_2$O$_5$ wetting layer. |

From the data of curves A and B, it is able to know that the transmittances of UV light, visible light, and near-infrared light of the transparent conductive film 1 of the present invention are all greater than 70% in the case of properly designing the thickness of the Nb$_2$O$_5$ wetting layer 12. Moreover, the transparent of near-infrared light of the transparent conductive film 1 can also be modulated to be higher than 90% by adjusting the thickness of the Nb$_2$O$_5$ wetting layer 12. Therefore, experimental data of FIG. 5 have proved that this novel transparent conductive substrate introduced by the present invention does indeed show the outstanding property of transmittance.

Figure 6:
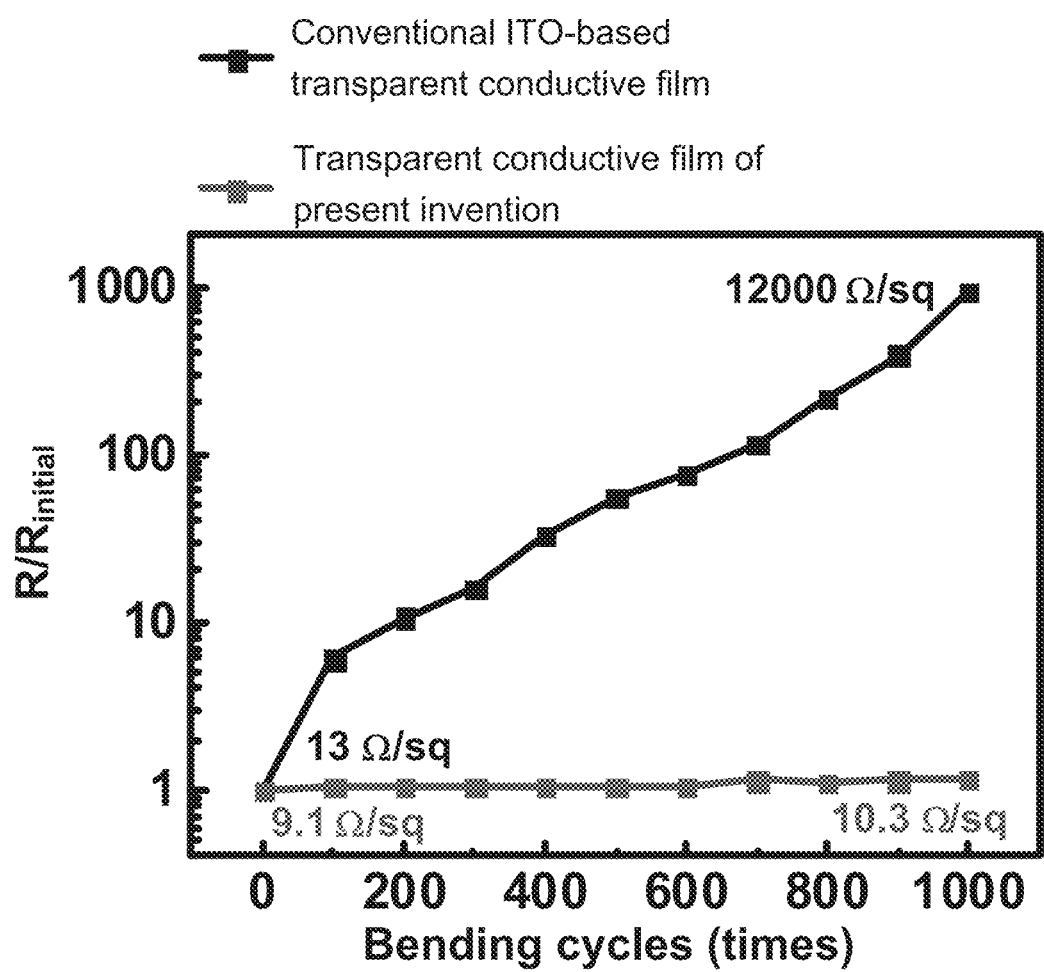
FIG. 6 shows a data curve graph of bending cycles versus resistance ratio.

Furthermore, for verifying whether the transparent conductive film 1 of the present invention can be applied in flexible electro-optical devices or displays or not, a bending cycle test has been applied to the conventional ITO transparent conductive substrate and the transparent conductive film 1 of the present invention as shown in FIG. 2. FIG. 6 shows a data curve graph of bending cycles versus resistance ratio, wherein the resistance ratio ($R/R_{initial}$) is obtained through dividing a post-test sheet resistance by an initial (pre-test) sheet resistance. Measurement data of FIG. 6 indicate that the initial sheet resistance of the transparent conductive film is 9.1 ohm/sq and lower than the initial sheet resistance (13 ohm/sq) of the ITO transparent conductive substrate. It is worth describing that, after applying 1,000-time bending cycle test to the transparent conductive film 1 of the present invention by a curvature radius of 2.5 mm and the ITO transparent conductive substrate, the sheet resistance of the transparent conductive film 1 increases from 9.1 ohm/sq to 10.3 ohm/sq; however, the sheet resistance of the ITO transparent conductive substrate abruptly increases from 13 ohm/sq to 12,000 ohm/sq.

Therefore, above-presented experimental data have proved that the transparent conductive film 1 introduced by the present invention includes advantages of low sheet resistance, high transmittance, great flexibility, such that this novel transparent conductive film 1 can not only be applied in the fabrication of some electro-optical devices such as organic solar cell and OLED, but can also be further constituted to a touch panel with controlling and sensing circuitry.

First Application Embodiment of the Transparent Conductive Film

Figure 7:
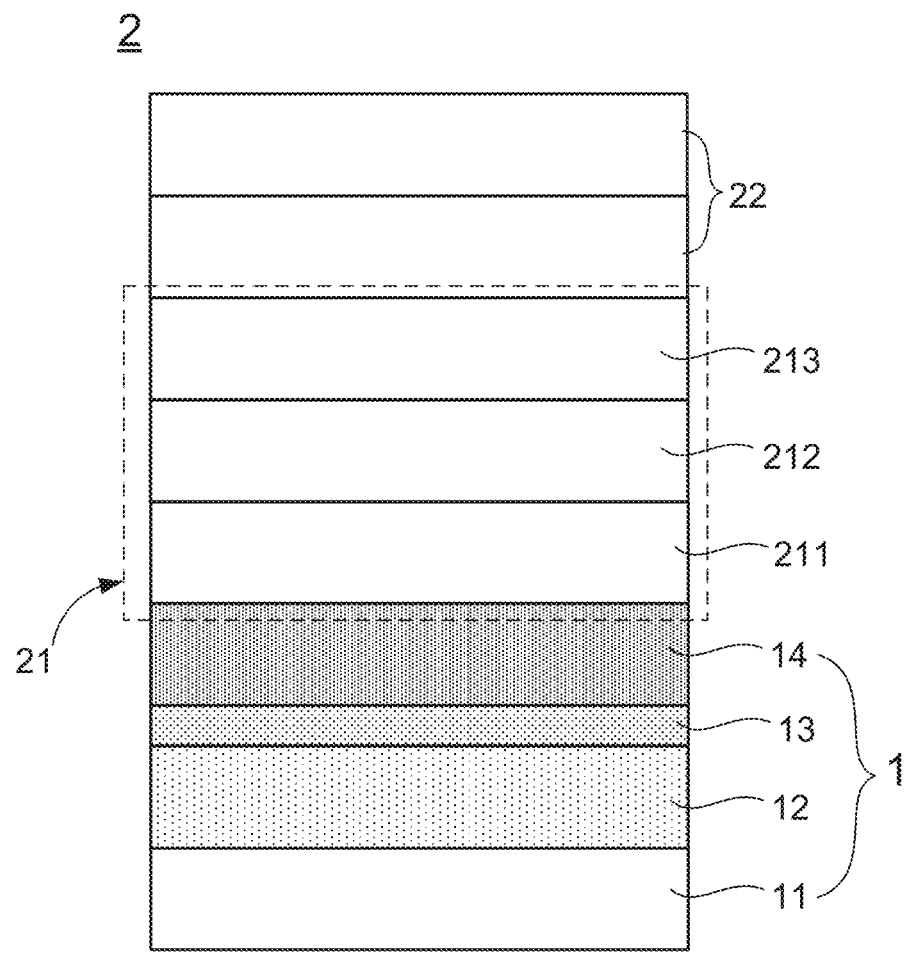
FIG. 7 shows a schematic cross-sectional side view of an organic light-emitting diode (OLED) having the transparent conductive film of the present invention.

Above descriptions have clearly introduced the constitution, features and advantages of the transparent conductive film of the present invention. Subsequently, some electro-optical devices having the transparent conductive film will be introduced in following paragraphs. Please refer to FIG. 7, which illustrates a schematic cross-sectional side view of an organic light-emitting diode (OLED) having the transparent conductive film of the present invention. As FIG. 7 shows, the OLED 2 mainly comprises: the transparent conductive film 1 of the present invention, an organic active layer 21 and a cathode layer 22.

It is worth noting that, the transparent conductive film 1 further comprises an anti-reflective layer 14 disposed between the organic active layer 21 and the metal layer 13, so as to facilitate the OLED 2 exhibit outstanding performance on its out-coupling efficiency ($\eta_{out}$), external quantum efficiency (EQE) and power efficiency.

As engineers skilled in the development and manufacture of OLED know, the said organic active layer 21 often comprises: a hole transport layer 211, at least one host light-emitting layer 212 doped with at least guest dye, and an electron transport layer 213. In the first embodiment of the present invention, the anti-reflective layer 14 is made of 2,3,6,7,10,11-hexacyano-1,4,5,8,9,12-hexaazatriphenylene (HAT-CN). As a result, the EQE of the OLED 2 can be enhanced due to the help of the hole transport function of the anti-reflective layer 14.

Herein it is emphasized that, the technology features of the first application embodiment does not include the limitations on marital selection or composition of the hole transport layer 211, the host light-emitting layer 212, the guest dye, and the electron transport layer 213. However, commonly used materials for the hole transport layer 211, the host light-emitting layer 212, the guest dye, and the electron transport layer 213 are still integrated in following Table (7).

TABLE (7)

| | Commonly used materials |
|---|---|
| hole transport layer 211 | Synonym: TAPC<br>Name: 1,1-bis[4-[N,N'-di(p-tolyl)amino]phenyl]cyclohexane |
| host light-emitting layer 212 | Synonym: CBP<br>Name: 4,4'-Bis(N-carbazolyl)-1,1'-biphenyl |
| guest dye (red) | Synonym: Ir(piq)2(acac)<br>Name: Bis(1-phenylisoquinoline)(acetylacetonate)iridium(III)) |
| guest dye (green) | Synonym: Ir(ppy)2acac<br>Name: Bis[2-(2-pyridinyl-N)phenyl-C](acetylacetonato)iridium(III) |
| guest dye (blue) | Synonym: FirPic<br>Name: Bis(3,5-difluoro-2-(2-pyridyl)phenyl-(2carboxypyridl)iridium(III)) |
| guest dye (yellow) | Synonym: PO-01-TB<br>Name: Acetylacetonatobis(4-(4-tert-butylphenyl)-thieno[3,2-c]pyridinato-C2,N)iridium |
| guest dye (white) | FirPic + O-01-TB |
| electron transport layer 213 | Synonym: B3PYMPM<br>Name: 4,6-Bis(3,5-di(pyridin-3-yl)phenyl)-2-MethylpyriMidine |
| cathode 22 | made of lithium fluoride (LiF) and aluminum (Al) |

Figure 8:
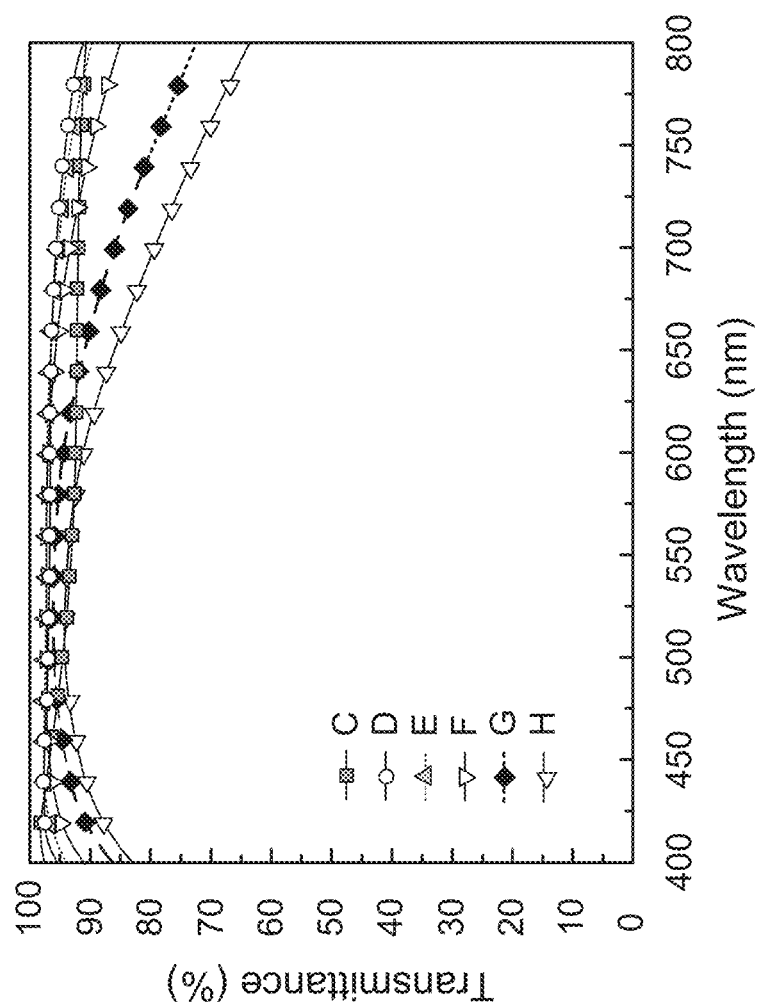
FIG. 8 shows a data curve graph plotted by wavelength versus transmittance.

For confirming that the disposing of the anti-reflective layer 14 would not affect the transmittance and conductivity of the transparent conductive film 1, data of transmittance and conductivity are measured from the transparent conductive film 1 having the anti-reflective layer 14. FIG. 8 shows a data curve graph plotted by wavelength versus transmittance, and information of curves A-H are integrated in following Table (8). Moreover, measured data of the transmittance and the conductivity of the transparent conductive film 1 are recorded in Table (9) as below.

TABLE (8)

| Curve | Information |
|---|---|
| C | Curve C is measured from a test sample constituted by a 30 nm thick $Nb_2O_5$ wetting layer, a 5 nm thick silver-made metal layer, and a 50 nm thick HAT-CN-made reflective layer. |
| D | Curve D is measured from a test sample constituted by a 30 nm thick $Nb_2O_5$ wetting layer, a 7 nm thick silver-made metal layer, and a 50 nm thick HAT-CN-made reflective layer. |
| E | Curve E is measured from a test sample constituted by a 30 nm thick $Nb_2O_5$ wetting layer, a 9 nm thick silver-made metal layer, and a 50 nm thick HAT-CN-made reflective layer. |
| F | Curve E is measured from a test sample constituted by a 30 nm thick $Nb_2O_5$ wetting layer, a 11 nm thick silver-made metal layer, and a 50 nm thick HAT-CN-made reflective layer. |
| G | Curve E is measured from a test sample constituted by a 30 nm thick $Nb_2O_5$ wetting layer, a 13 nm thick silver-made metal layer, and a 50 nm thick HAT-CN-made reflective layer. |
| H | Curve E is measured from a test sample constituted by a 30 nm thick $Nb_2O_5$ wetting layer, a 15 nm thick silver-made metal layer, and a 50 nm thick HAT-CN-made reflective layer. |

TABLE (9)

| Measurement item | $t_{Ag}$ = 5 nm | $t_{Ag}$ = 7 nm | $t_{Ag}$ = 9 nm | $t_{Ag}$ = 11 nm | $t_{Ag}$ = 13 nm |
|---|---|---|---|---|---|
| transmittance @555 nm (%) | 93.3 | 96.9 | 97.5 | 97.5 | 96.1 |
| Sheet resistance (ohm/sq) | 115 | 53 | 11 | 10 | 5 |
| FoM | 46 | 224 | 1345 | 1877 | 1317 |

Data of curves A and B indicate that the transmittances of UV light, visible light, and near-infrared light of the transparent conductive film 1 having the reflective layer 14 are all greater than 90%. Herein it need to further explain that, the FoM in Table (9) means Figure of Merit and is calculated by using formula of $\sigma_{DC}/\sigma_{Op}$, wherein $\sigma_{DC}$ and $\sigma_{DC}$ are electrical conductivity and optical conductivity, respectively. Thus, experimental data have proved that the disposing of the anti-reflective layer 14 would not cause the decline of the transmittance and conductivity of the transparent conductive film 1.

From literature 1, engineers skilled in the development and manufacture can understand that, commercial OLED have a low out-coupling efficiency due to factors such as electrode absorption and surface plasmon polaritons (SPPs). So that, in order to effectively enhance the out-coupling efficiency of the OLED 2 as shown in FIG. 7, the inventors have found the ideal thickness for the organic active layer 21 and the $Nb_2O_5$-mad wetting layer 12 by way of changing the two layers' thickness and then observing optical interference occurring in the internal of the OLED 2.

Figure 9A:
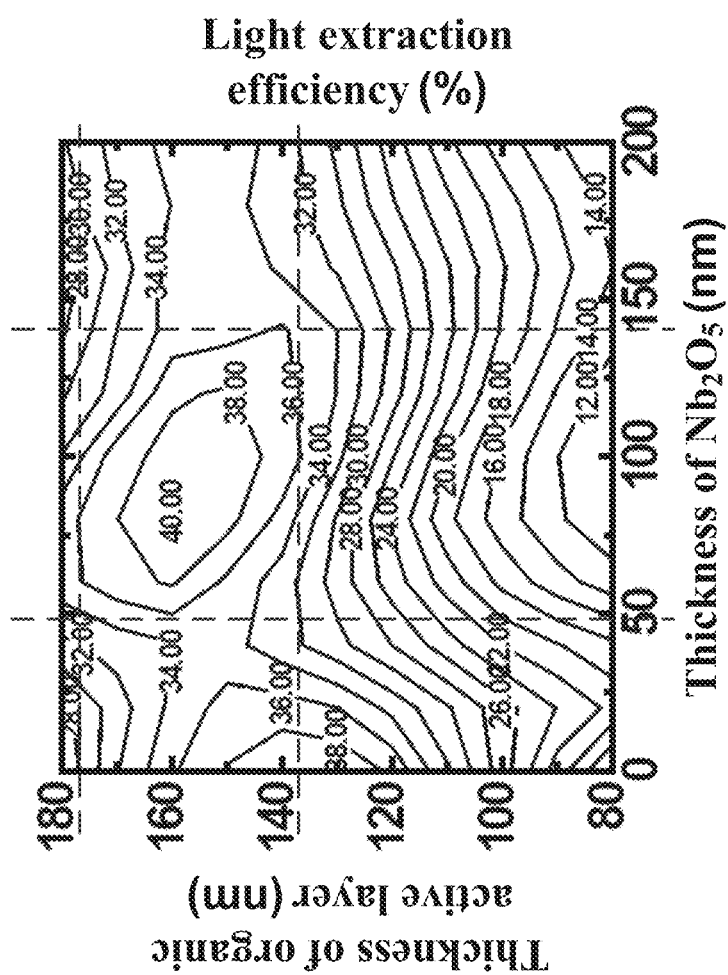
FIGS. 9A, 9B and 9C show simulated radiance contour plots of light extraction efficiency of the OLED having the transparent conductive film of the present invention as functions of $Nb_2O_5$ thickness versus thickness of organic active layer.
Figure 9B:
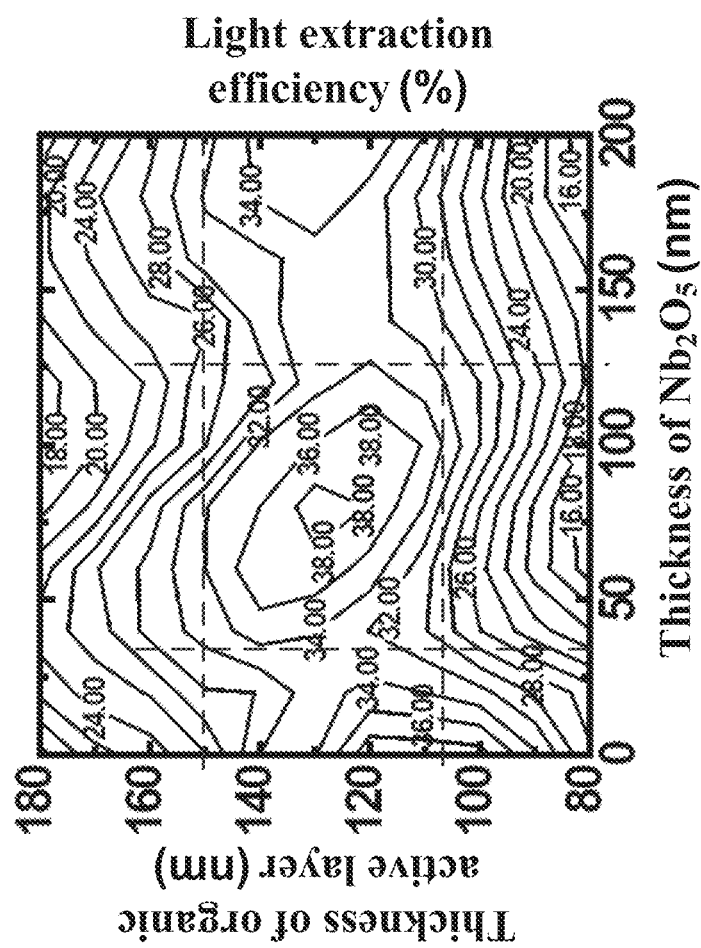
Figure 9C:
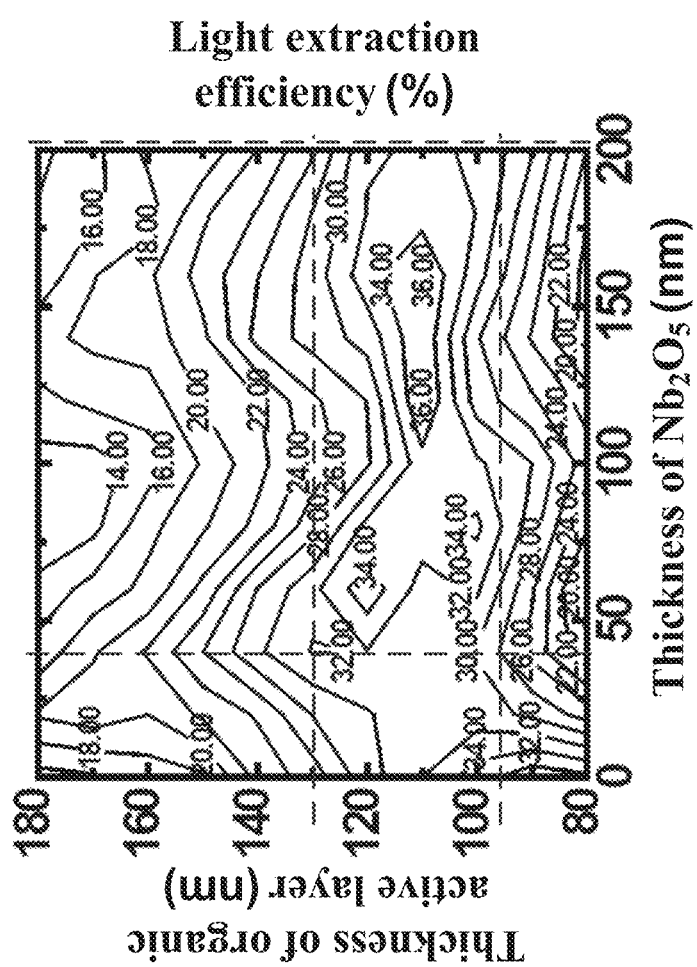

FIGS. 9A, 9B and 9C present simulated radiance contour plots of light extraction efficiency of the OLED with the transparent conductive film of the present invention as functions of $Nb_2O_5$ thickness versus thickness of organic active layer. Simulated data of FIG. 9A, FIG. 9B and FIG. 9C are measured from a red OLED, a green OLED and a blue OLED. Moreover, it is able to know that the discrepancies between the three types of OLED are merely on the kind of guest dye. FIG. 9A indicates that the light extraction efficiency of the red OLED is greater than 20% when the thickness of the organic active layer 21 is thicker than 90 nm as well as the thickness of the $Nb_2O_5$-made wetting layer 12 is in a range between 1 nm and 200 nm. Moreover, in the case of the thickness of the organic active layer 21 being controlled between 130 nm and 170 nm as well as the $Nb_2O_5$-made wetting layer 12 being ranged from 50 nm to 150 nm, the red OLED exhibits the best light extraction efficiency.

Moreover, FIG. 9B indicates that the light extraction efficiency of the green OLED is greater than 20% when the thickness of the organic active layer 21 is thicker than 90 nm as well as the thickness of the $Nb_2O_5$-made wetting layer 12 is in a range between 25 nm and 150 nm. It is worth noting that, in the case of the thickness of the organic active layer 21 being controlled between 110 nm and 150 nm as well as the $Nb_2O_5$-made wetting layer 12 being ranged from 35 nm to 130 nm, the green OLED exhibits the best light extraction efficiency. On the other hand, FIG. 9C indicates that the light extraction efficiency of the blue OLED is greater than 20% when the thickness of the organic active layer 21 is thicker than 90 nm as well as the thickness of the $Nb_2O_5$-made wetting layer 12 is in a range between 1 nm and 200 nm. Moreover, in the case of the thickness of the organic active layer 21 being controlled between 90 nm and 130 nm as well as the $Nb_2O_5$-made wetting layer 12 being ranged from 35 nm to 200 nm, the blue OLED exhibits the best light extraction efficiency.

Data of the best thickness for the organic active layer 21 and $Nb_2O_5$-made wetting layer 12 of the OLED 2 as shown in FIG. 7 are herein integrated in following Table (10). Thus, from Table (10), it is understood that 130 nm and 50-130 nm are the best thickness for the organic active layer 21 and $Nb_2O_5$-made wetting layer 12 for the fabrication of the three types of OLED.

TABLE (10)

| Type of OLED | Best thickness for the organic active layer | Best thickness for the $Nb_2O_5$-made wetting layer |
| --- | --- | --- |
| Red OLED | 130-170 nm | 50-150 nm |
| Green OLED | 110-150 nm | 35-130 nm |
| Blue OLED | 90-130 nm | 35-200 nm |

Figure 10:
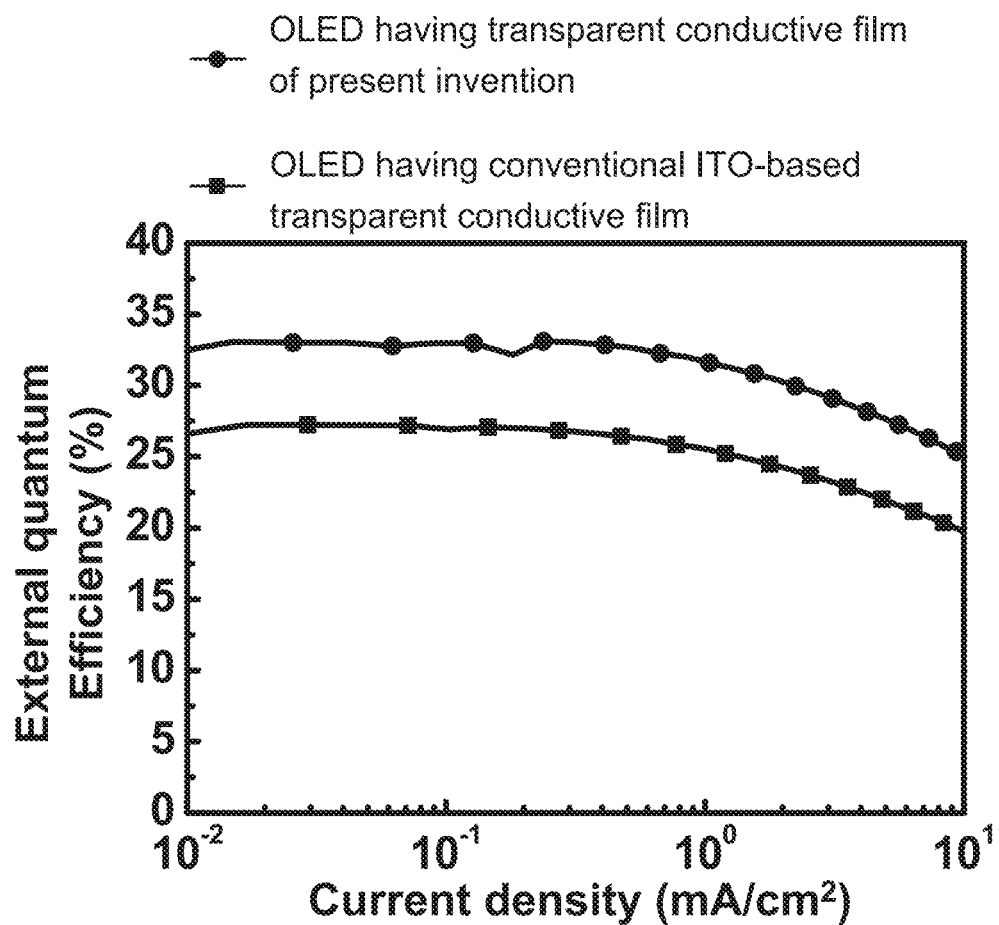
FIG. 10 shows a data curve graph plotted by current density versus external quantum efficiency.
Figure 11:
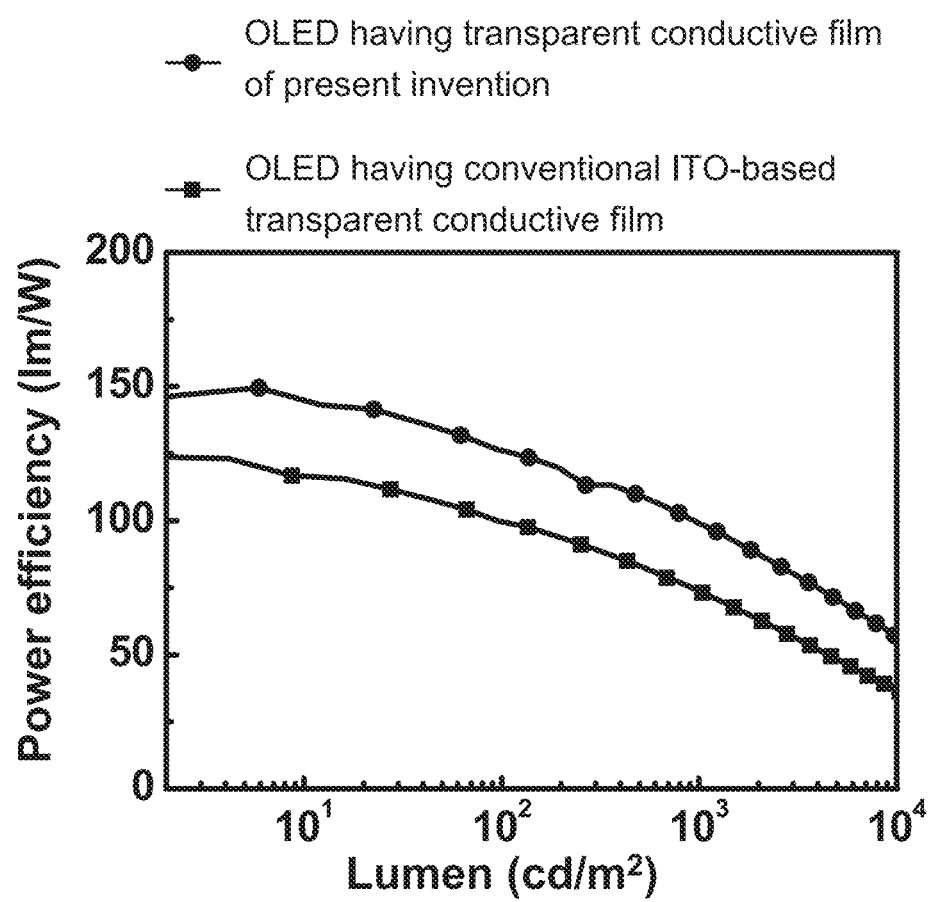
FIG. 11 shows a data curve graph of lumen versus power efficiency.

Please continuously refer to FIG. 10 and FIG. 11, wherein FIG. 10 shows a data curve graph of current density versus external quantum efficiency and FIG. 11 shows a data curve graph of lumen versus power efficiency. Data of FIG. 10 and FIG. 11 indicate that the OLED having this novel transparent conductive film exhibit outstanding out-coupling efficiency ($\eta_{out}$), external quantum efficiency (EQE) and power efficiency better than those measured from the OLED having conventional ITO transparent conductive substrate.

Therefore, above-presented measurement data of organic light-emitting devices have proved that this novel transparent conductive film 1 can indeed be applied in one organic light-emitting device for enhancing the electro-optical properties of the organic light-emitting device.

Second Application Embodiment of the Transparent Conductive Film

Figure 12:
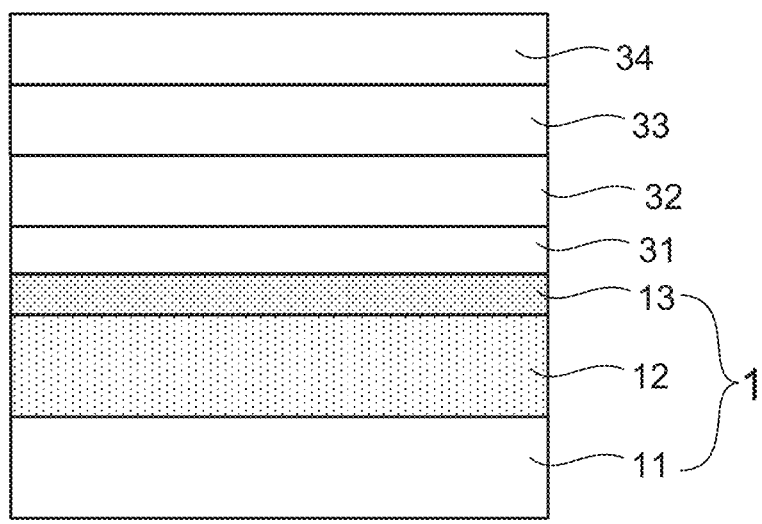
FIG. 12 shows a schematic cross-sectional side view of an organic solar cell having the transparent conductive film of the present invention.

The transparent conductive film 1 of the present invention can also be applied in the fabrication of conventional organic solar cells. Please refer to FIG. 12, which illustrates a schematic cross-sectional side view of an organic solar cell having the transparent conductive film of the present invention. As FIG. 12 shows, the organic solar cell 3 comprises: the transparent conductive film 1 of the present invention, an electron extraction layer 31, a photoactive layer 32, a hole transport layer 33, and an electrode layer 34, wherein the electron extraction layer 31 is also called electron transport layer.

As engineers skilled in the development and manufacture of organic solar cells know, the photoactive layer 32 comprises a donor material and an acceptor material. In the second application embodiment, the donor material is PTB7 (Poly[[4,8-bis[(2-ethylhexyl)oxy]benzo[1,2-b']dithiophene-2,6-diyl][3-fluoro-2-[(2-ethylhexyl)carbonyl]thieno[3,4-b]thiophenediyl]]), and the acceptor material is $PC_{71}BM$ ([6,6]-phenyl C71 butyric acid methyl ester). In addition, other materials can be used as the donor material and/or the acceptor material are listed in following Table (11).

| Donor material | Acceptor material |
| --- | --- |
| squaraine (SQ) | 3,4,9,10-perylenetetracarboxylic dianhydride (PTCDA) |
| boron subphthalocyanonine chloride (SubPc) | perfluorinated copper phthalocyanine (F16-CuPc) |
| copper phthalocyanine (CuPc) | [6,6]-phenyl C61 butyric acid methyl ester (PCBM) |
| chloro-aluminum phthalocyanine (ClAlPc) | [6,6]-phenyl C70 butyric acid methyl ester ($PC_{70}BM$) |
| poly(3-hexylthiophene) (P3HT) | |
| tin phthalocyanine (SnPc) | |
| pentacene | |
| naphthacene | |
| diindenoperylene (DIP) | |

The said electron extraction layer 31 is often made of a low work function material such as calcium ($\Psi_B$=2.9 eV). On the other hand, material for forming the hole transport layer 33 can be $MoO_3$ or PEDOT:PSS (poly(3,4,-ethylene dioxythiophene):polystyrene sulfonic acid). It is worth noting that the said electrode layer 34 is made of silver and used as an anode, and the metal layer 13 of the transparent conductive film 1 of the present invention is used as another one electrode, i.e., the cathode. Next, in order to effectively enhance the short-circuit current of the organic solar cell 3 as shown in FIG. 12, the inventors have found the ideal thickness for the metal layer 13 and the $Nb_2O_5$-mad wetting layer 12 by way of changing the two layers' thickness and then observing optical interference occurring in the internal of the organic solar cell 3.

Figure 13:
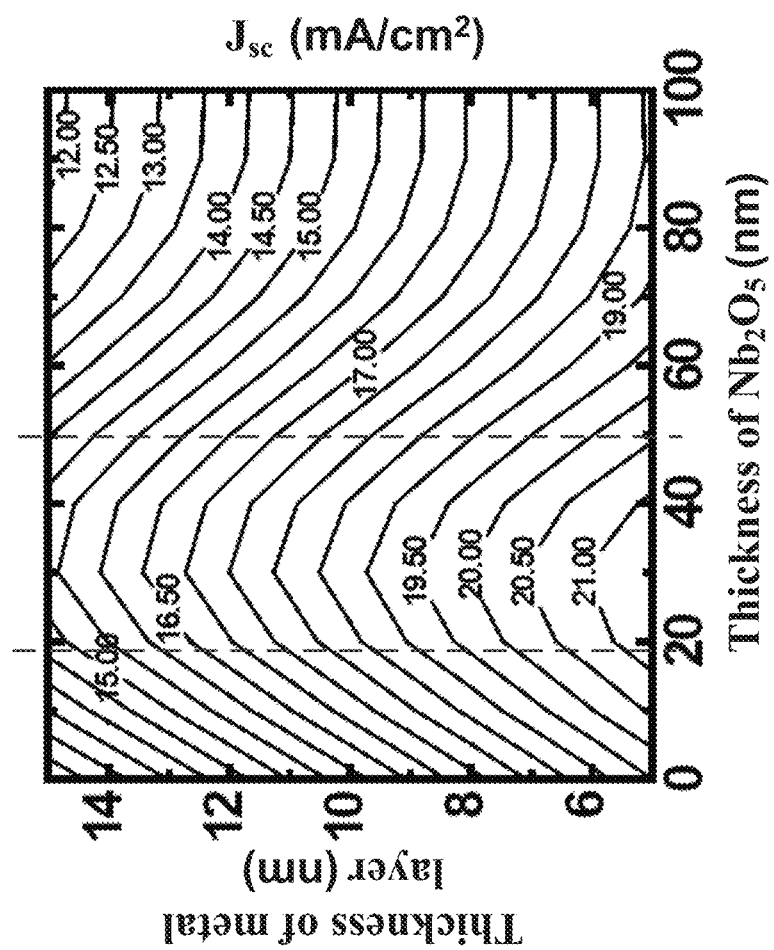
FIG. 13 shows a simulated radiance contour plot of short-circuit current of the organic solar cell having the transparent conductive film of the present invention as functions of $Nb_2O_5$ thickness versus thickness of metal layer.

FIG. 13 shows a simulated radiance contour plot of short-circuit current of the organic solar cell having the transparent conductive film of the present invention as functions of $Nb_2O_5$ thickness versus thickness of metal layer.

FIG. 13 indicates that the current density of the organic solar cell 3 is greater than 12 $mA/cm^2$ when the thickness of the metal layer 13 is thicker than 5 nm as well as the thickness of the $Nb_2O_5$-made wetting layer 12 is in a range between 1 nm and 80 nm. Moreover, in the case of the $Nb_2O_5$-made wetting layer 12 being ranged from 20 nm to 50 nm, the organic solar cell exhibits the highest current density (>>15 $mA/cm^2$) and the best power conversion efficiency (PCE).

Figure 14:
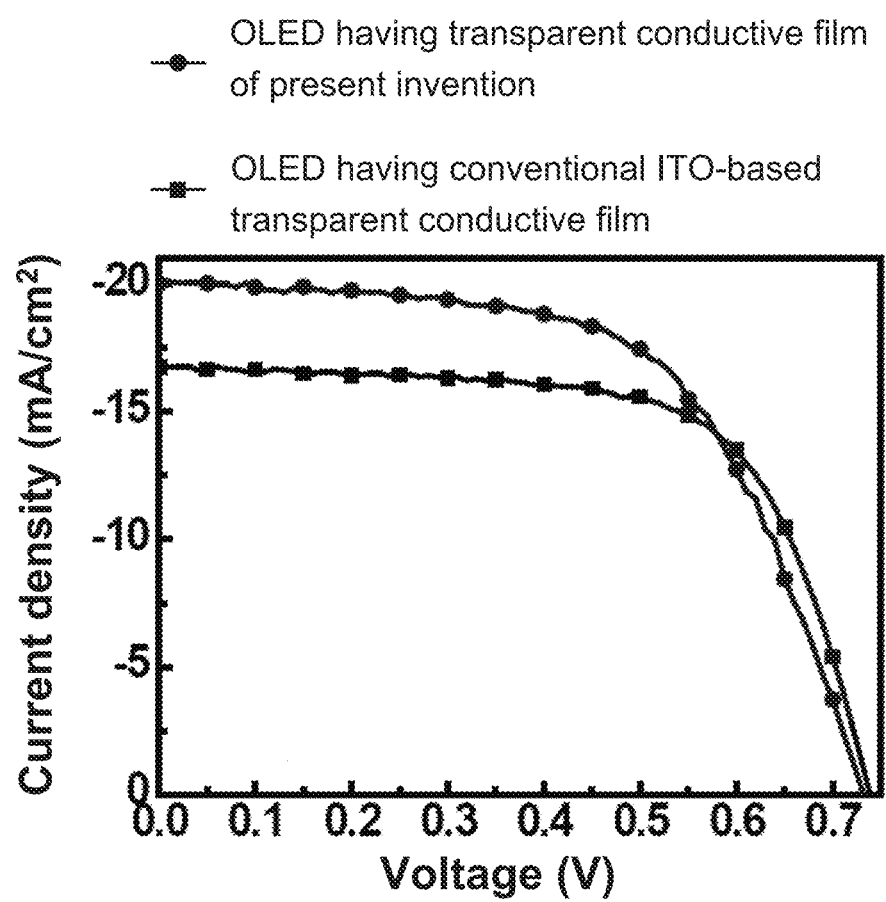
FIG. 14 shows a data curve graph of voltage versus current density.
Figure 15:
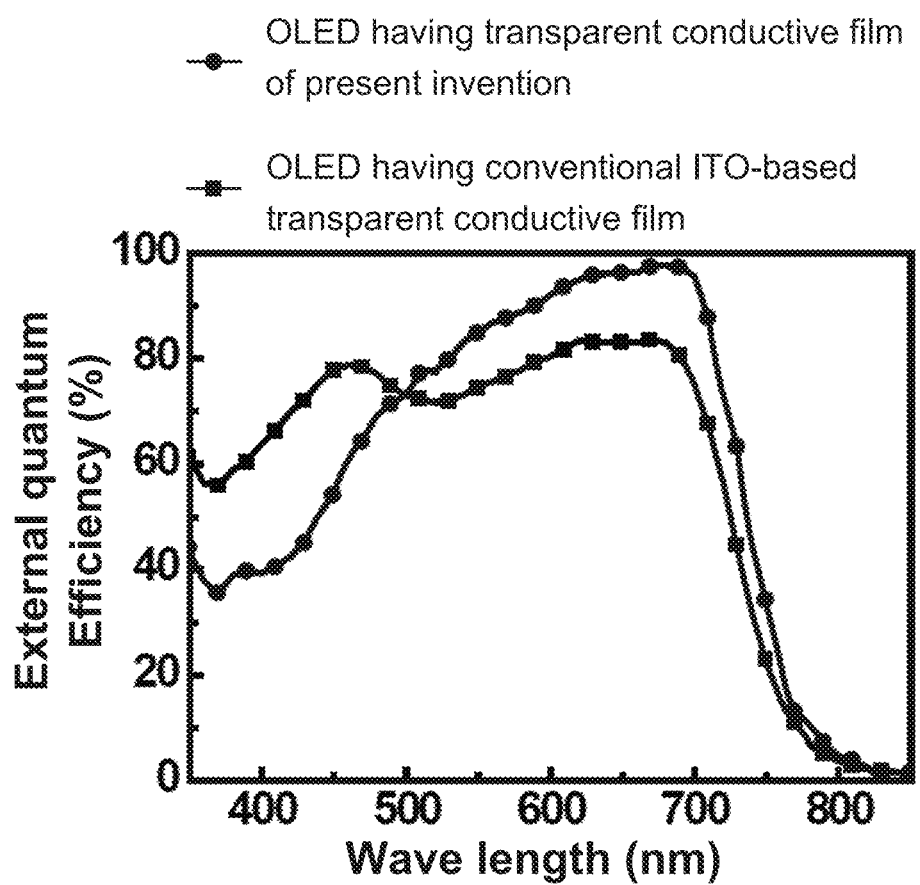
FIG. 15 shows a data curve graph of wavelength versus external quantum efficiency.

Please continuously refer to FIG. 14 and FIG. 15, wherein FIG. 14 shows a data curve graph of voltage versus current density and FIG. 15 shows a data curve graph of wavelength versus external quantum efficiency. Data of FIG. 14 and FIG. 15 indicate that the organic solar cell having this novel transparent conductive film exhibit outstanding power conversion efficiency, current density, and external quantum efficiency (EQE) better than those measured from the organic solar cell having conventional ITO transparent conductive substrate. Therefore, above-presented measurement data of organic solar cells have proved that this novel transparent conductive film 1 can indeed be applied in one organic solar cell for enhancing the electro-optical properties of the organic solar cell.

Therefore, through above descriptions, the transparent conductive film and electro-optical devices having the same provided by the present invention has been introduced completely and clearly; in summary, the present invention includes the advantages of:

(1) Compared to traditional ITO transparent substrate showing drawbacks of high sheet resistance, poor flexibility and high manufacturing cost, the present invention mainly discloses a transparent conductive film fabricated by sequentially forming a wetting layer and an ultra-thin metal layer onto a transparent substrate, wherein the transparent conductive film includes advantages of low sheet resistance, high transmittance, great flexibility, and low manufacturing cost.

(2) In addition, experimental data have proved that this novel transparent conductive film 1 can indeed be applied in one organic light-emitting device for enhancing the electro-optical properties of the organic light-emitting device, including out-coupling efficiency ($\eta_{out}$), external quantum efficiency (EQE) and power efficiency.

(3) Moreover, experimental data have also proved that this novel transparent conductive film 1 can indeed be applied in one organic solar cell for enhancing the electro-optical properties of the solar cell, including power conversion efficiency, current density, and external quantum efficiency (EQE).

The above description is made on embodiments of the present invention. However, the embodiments are not intended to limit scope of the present invention, and all equivalent implementations or alterations within the spirit of the present invention still fall within the scope of the present invention.

What is claimed is:

1. A transparent conductive film, comprising:
   a transparent substrate;
   a wetting layer, being formed on the transparent substrate, and having a first surface energy and a refractive index greater than 2.1; and
   a metal layer, being formed on the wetting layer by using sputter deposition process, and having a second surface energy;
   wherein the first surface energy must be greater than the second surface energy, such that the wetting layer is used for enhancing the wettability of the metal layer, so as to facilitate the metal layer exhibit an excellent conductivity as the metal layer formed on the wetting layer has an effective thickness;
   wherein the effective thickness is at least 5 nm.

2. The transparent conductive film of claim 1, further comprising an anti-reflective layer formed on the metal layer method.

3. The transparent conductive film of claim 1, wherein the metal layer is made of silver (Ag), and the wetting layer is made of a specific material selected from the group consisting of: niobium oxide ($Nb_2O_5$), titanium oxide ($TiO_2$), tellurium oxide ($TeO_2$), molybdenum oxide ($MoO_3$), zirconium oxide ($ZrO_2$), and tantalum oxide ($TaO_2$).

4. The transparent conductive film of claim 1, wherein the wetting layer is formed on the transparent substrate by using sputter deposition process.

5. The transparent conductive film of claim 2, wherein the anti-reflective layer is made of 2,3,6,7,10,11-hexacyano-1,4,5,8,9,12-hexaazatriphenylene (HAT-CN).

6. An electro-optical device, being an organic light-emitting diode (OLED) and comprising:
   a transparent conductive film, comprising:
      a transparent substrate;
      a wetting layer, being formed on the transparent substrate, and having a first surface energy and a refractive index greater than 2.1; and
      a metal layer, being formed on the wetting layer by using sputter deposition process, and having a second surface energy; wherein the first surface energy must be greater than the second surface energy, such that the wetting layer is used for enhancing the wettability of the metal layer, so as to facilitate the metal layer exhibit an excellent conductivity as the metal layer formed on the wetting layer has an effective thickness; moreover, the effective thickness is at least 5 nm;
   an anti-reflective layer, being formed on the metal layer of the transparent conductive film;
   an organic active layer, being formed on the anti-reflective layer; and
   an cathode layer, being formed on the organic active layer.

7. The electro-optical device of claim 6, wherein the anti-reflective layer is made of 2,3,6,7,10,11-hexacyano-1,4,5,8,9,12-hexaazatriphenylene (HAT-CN).

8. The electro-optical device of claim 6, wherein the organic active layer comprises: a hole transport layer, at least one host light-emitting layer doped with at least guest dye, and an electron transport layer.

9. The electro-optical device of claim 6, wherein the cathode layer is made of lithium fluoride (LiF) and aluminum (Al).

10. The electro-optical device of claim 6, wherein the wetting layer has a first thickness in a range from 50 nm to 130 nm, and the organic active layer having a second thickness greater than 90 nm.

11. An electro-optical device, being a solar cell and comprising:
    a transparent conductive film, comprising:
       a transparent substrate;
       a wetting layer, being formed on the transparent substrate, and having a first surface energy and a refractive index greater than 2.1; and
       a metal layer, being formed on the wetting layer by using sputter deposition process, and having a second surface energy; wherein the first surface energy must be greater than the second surface energy, such that the wetting layer is used for enhancing the wettability of the metal layer, so as to facilitate the metal layer exhibit an excellent conductivity as the metal layer formed on the wetting layer has an effective thickness; moreover, the effective thickness is at least 5 nm;
    an electron extraction layer, being formed on the metal layer of the transparent conductive film;
    a photoactive layer, being formed on the electron extraction layer;
    a hole transport layer, being formed on the photoactive layer; and
    an electrode layer, being formed on the hole transport layer.

12. The electro-optical device of claim 11, wherein the photoactive layer is made of a donor material and an acceptor material.

13. The electro-optical device of claim 11, wherein the electron extraction layer is made of a low work function material.

14. The electro-optical device of claim 11, wherein the hole transport layer is made of poly(3,4,-ethylene dioxythiophene):polystyrene sulfonic acid (PEDOT:PSS).

15. The electro-optical device of claim 11, wherein the electrode layer is made of silver (Ag).

16. The electro-optical device of claim 11, wherein the wetting layer has a first thickness in a range between 20 nm and 50 nm.

17. The electro-optical device of claim 12, wherein the donor material is selected from the group consisting of: poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), squaraine (SubPc), copper phthalocyanine (CuPc), chloro-aluminum phthalocyanine (ClAlPc), tin phthalocyanine (SnPc), poly(3-hexylthiophene) (P3HT), and diindenoperylene (DIP).

18. The electro-optical device of claim 12, wherein the acceptor material is selected from the group consisting of: [6,6]-phenyl C71 butyric acid methyl ester ($PC_{71}BM$), [6,6]-phenyl C61 butyric acid methyl ester (PCBM), [6,6]-phenyl C70 butyric acid methyl ester ($PC_{70}BM$), 3,4,9,10-perylenetetracarboxylic dianhydride (PTCDA), and perfluorinated copper phthalocyanine (F16-CuPc).

\* \* \* \* \*